United States Patent [19]

Tigwell

[11] Patent Number: 5,379,453
[45] Date of Patent: Jan. 3, 1995

[54] REMOTE CONTROL SYSTEM

[75] Inventor: David C. Tigwell, Spring, Tex.

[73] Assignee: Colorado Meadowlark Corporation, Littleton, Colo.

[21] Appl. No.: 183,225

[22] Filed: Jan. 18, 1994

Related U.S. Application Data

[63] Continuation of Ser. No. 950,927, Sep. 24, 1992, abandoned.

[51] Int. Cl.⁶ ............................................. H04B 14/04
[52] U.S. Cl. ........................... 455/151.2; 455/152.1; 455/352; 455/92; 340/825.72
[58] Field of Search ............... 455/151.1, 151.2, 151.3, 455/352, 92, 353, 150.1, 151.4, 152.1, 154.1, 154.2, 155.1; 340/825.57, 825.69, 825.72, 825.71; 348/211, 734; 375/25

[56] References Cited

U.S. PATENT DOCUMENTS

| | | |
|---|---|---|
| 2,558,434 | 6/1951 | Hofberg . |
| 3,041,507 | 6/1962 | Rose et al. . |
| 3,716,865 | 2/1973 | Willmott . |
| 3,936,833 | 2/1976 | Bush . |
| 4,141,010 | 2/1979 | Umpleby . |
| 4,241,870 | 12/1980 | Marcus . |
| 4,247,850 | 1/1981 | Marcus . |
| 4,286,262 | 8/1981 | Wahl . |
| 4,385,296 | 5/1983 | Tsubaki . |
| 4,426,637 | 1/1984 | Apple . |
| 4,447,808 | 5/1984 | Marcus . |
| 4,485,382 | 11/1984 | Moore . |
| 4,535,333 | 8/1985 | Twardowski . |
| 4,623,887 | 11/1986 | Welles, II . |
| 4,626,848 | 12/1986 | Ehlers .................... 340/825.69 |
| 4,712,105 | 12/1987 | Kohler . |
| 4,731,605 | 3/1988 | Nixon . |
| 4,750,118 | 6/1988 | Heltschel et al. . |
| 4,771,283 | 9/1988 | Imoto .................... 455/352 |
| 4,825,200 | 4/1989 | Evans et al. . |
| 4,833,727 | 5/1989 | Calvet et al. .............. 455/151.2 |
| 4,847,601 | 7/1989 | Conti . |
| 4,878,052 | 10/1989 | Schulze . |
| 4,905,279 | 2/1990 | Nishio .................... 455/352 |
| 4,912,463 | 3/1990 | Li . |
| 4,959,810 | 9/1990 | Darbee et al. ............ 455/352 |
| 4,988,992 | 1/1991 | Heitschel . |
| 5,227,780 | 7/1993 | Tigwell . |

Primary Examiner—Reinhard J. Eisenzopf
Assistant Examiner—Nguyen Vo
Attorney, Agent, or Firm—Harness, Dickey & Pierce

[57] ABSTRACT

A remote control system having a universal transmitter capable of being programmed to match the frequency and modulation pattern of any pulse modulated remote control transmitter. The system combines the universal transmitter and a separate apparatus for programming the universal transmitter. The programming unit detects the frequency and modulation pattern transmitted by a selected transmitter. The programming unit transfers the detected modulation pattern to the universal transmitter. The universal transmitter is operative to transmit the frequency detected by the programming unit. The universal transmitter thus duplicates the transmission of the selected transmitter. The system, apparatus and methods of this invention are particularly well adapted for application to low cost remote control transmitters permanently installed in vehicles.

14 Claims, 6 Drawing Sheets

REMOTE CONTROL SYSTEM

This is a continuation of U.S. patent application Ser. No. 07/950,927, filed Sep. 24, 1992.

FIELD OF THE INVENTION

The present invention is in the field of remote control devices and more specifically relates to a programming system for universal remote control transmitters operating, for example, in the ultra-high frequency (UHF) range.

BACKGROUND OF THE INVENTION

Remote control devices are used widely in the home and in industry for operation of appliances and equipment and in access and security systems. A popular use of such devices is to operate doors, gates, lights and security systems. It is particularly desirable to employ a remote control device within a vehicle to control such devices without exiting from the vehicle. One of the most widely used of these applications is the use of a remote control transmitter/receiver system to control garage doors to allow entry or exit of a vehicle. Remote control devices used out-of-doors, such as those used for access to doors or gates, typically employ UHF radio transmission.

In general, a remote control system has a remote transmitter and a receiver coupled to the device which is to be controlled. When activated, the transmitter emits a modulated signal which is recognized by the receiver which then activates the device in response to the transmitted signal. In UHF-based systems, a transmitter typically emits a pulse-modulated UHF signal. The signal embodies a modulation pattern as a sequence of "signal on" and "signal off" intervals. The modulated signal emitted by the transmitter is recognized by the receiver.

The modulation pattern of remote controls used for access to garages, homes and businesses or for security systems is typically unique to restrict unauthorized access to the device being controlled.

For convenience of use with access and security devices, it is desirable to have a remote control within a vehicle. Presently this is accomplished for the most part by carrying a portable battery-powered remote control transmitter supplied by the device manufacturer in the vehicle. Often such portable transmitters are clipped to visors, or left loose on dashboard and seats. A variety of means for holding such portable transmitters within a vehicle are available. However, the car owner must go to the trouble of installing the holder and then inserting his portable transmitter in the holder. Further, all such holders are still susceptible to easy removal from the vehicle. The security of an in-vehicle remote control transmitter can be maximized by employing a permanently installed transmitter which, for example, is not readily removed from the vehicle. Further, permanent factory installations allow improved ergonomics and esthetics inside the vehicle. For example, the transmitter actuator switch can be conveniently located on the dash or steering column allowing easy access for the driver, and unobtrusive bending with the vehicle's interior decor.

Permanently installed remote controls have been offered as buyer option on new cars, for example, but a purchaser of this option must also purchase a receiver compatible with the installed transmitter or purchase an adapter for his existing receiver to make it compatible with the installed remote control transmitter.

Different manufacturers of UHF remote control systems use different frequencies for transmission as well as different modulation protocols. For example, the length of the on/off intervals in a pulse modulation protocol will vary from manufacturer to manufacturer. In order to obtain a UHF transmitter compatible with an existing receiver, it is necessary to know the transmission frequency accepted by the receiver and have a means for matching or determining the modulation pattern recognized by the receiver. In a number of UHF transmitter/receivers, the modulation pattern is determined by a set of dip switches on the transmitter and receiver. Once the required frequency and the modulation protocol are defined, a compatible new transmitter can be obtained, and dip switches or other modulation pattern selection means can be employed to match the pattern transmitted by a new transmitter to that of the existing receiver. Alternatively, both the existing receiver and new transmitter can be programmed with a new modulation pattern. Such means for programming a transmitter/receiver with a modulation pattern is not universally applicable to all UHF remote control systems. Further, such means as dip switches change only the modulation pattern and cannot be adapted to different modulation protocols. It may not be desirable for security reasons to employ dip switches to set a modulation pattern, since the pattern can be determined by examination of the dip switch pattern of a transmitter. It may not be desirable to employ a transmitter whose modulation pattern can be inadvertently changed by accidental modification of the dip switch pattern or changed by unauthorized access to the dip switches or other pattern selection means.

Means for programming a transmitter to transmit the modulation pattern of an existing programmed transmitter or to transmit a modulation pattern recognized by a receiver are known. However, these methods require prior knowledge of the frequency of transmission and modulation protocol and require the use of compatible transmitters and receivers. These methods also require the use of more complex transmitters and/or receiving systems. The transmitter to be programmed must also have a receiver for receiving a modulated signal and circuitry for demodulating the signal to determine the modulation pattern in addition to a memory for storing the modulation pattern. In some cases the receiver which activates the device must also be capable of transmitting a modulated signal.

To minimize cost and maximize convenience of manufacture for a transmitter, particularly when it is to be permanently installed in a vehicle as a factory installed option, it is desirable to employ a transmitter that can be programmed to replace the widest variety of existing remote control transmitters. The device should be programmable for any legal UHF frequency and compatible with any modulation scheme. Since all currently manufactured UHF remote control systems employ some kind of pulse modulation protocol, the preferred transmitter must be capable of functioning to emit a pulse-modulated UHF signal.

Means are known in the art for determining the frequency transmitted by a remote control transmitter and means are known for tuning a transmitter to a frequency transmitted by another transmitter. Means are also known for determining the pulse-modulation pattern emitted by a transmitter.

For example, means are known in the art for matching the carrier frequency/modulation pattern transmitted by an Infra-red-based (IR) remote control transmitter in a second IR transmitter. See, for example, U.S. Pat. No. 4,623,887 to Welles and U.S. Pat. No. 4,825,200 to Evans et al., both teaching a microprocessor-based IR remote control unit including an IR transmitter and an IR receiver for receiving signals from another remote controller to be emulated.

In contrast to modulated IR transmission, it is more difficult to determine the frequency and modulation pattern of a UHF pulse-modulated signal, and, as a consequence, relatively expensive devices are required to do this.

The programming system of the present invention produces the desired result of a universal transmitter capable of being programmed to function with most existing UHF receiver/devices (and all currently manufactured UHF receivers) at a relatively low cost which does not require the purchase of additional receivers or adapters and does not require owner installation.

SUMMARY OF THE INVENTION

It is an object of this invention to provide a low cost remote control transmitter that can be programmed to actuate any remote control receiver that recognizes a pulse-modulated transmission without prior knowledge of the frequency and modulation pattern recognized by that receiver. The transmitter of this invention is universal in that it is capable of transmitting at any frequency that is allocated for remote control devices and is capable of being programmed to generate a pulse-modulated signal with any modulation pattern based on any pulse-modulation protocol. The universal transmitter is capable of being tuned and encoded with a modulation pattern to match the transmission of any currently manufactured pulse-modulated remote control transmitter. The universal transmitter of this invention can be permanently installed in a vehicle, for example as a factory-installed option. In this application, the universal transmitter can be programmed, after purchase of the vehicle, to actuate a selected remote control receiver. The vehicle owner is not required to purchase an additional receiver or adapter to make the universal transmitter compatible with that remote control receiver.

In the furtherance of these objectives, this invention provides a universal transmitter and apparatus and methods of programming such a transmitter. This invention, in particular, provides a remote control system combining a universal transmitter and a programming unit particularly adapted to transfer the frequency and modulation pattern from an existing encoded pulse-modulated transmitter which serves as a template to the universal transmitter. The template transmitter is a transmitter that emits a signal at a particular frequency and with a particular modulation pattern that is recognized by the receiver of a remote controlled device, and functions to actuate that device. After the frequency and modulation pattern are transferred from the template transmitter to the universal transmitter via the programming unit, the programmed universal transmitter functions to actuate the same device or devices controlled by the template transmitter.

The remote control system of this invention includes a universal transmitter and a programming unit separate from the transmitter. The universal transmitter has a means for transmitting a pulse-modulated signal, a means for determining the frequency of the signal that is transmitted and a memory means for storing a modulation pattern in digital form. In order to insure low cost of the universal transmitter, it preferably does not contain a receiver, any means for detecting the frequency of a signal nor any means for demodulation of a modulated signal. The programming unit, which can be employed to program any universal transmitter, contains a means for receiving a modulated signal and a means for detecting the frequency of a received signal. The programming unit also contains a means for demodulating the output signal from the receiver to determine the modulation pattern of a received signal which does not require prior knowledge of the modulation protocol employed in generating the modulated signal and a means for storing the modulation pattern determined in memory of the universal transmitter. The programmer optionally has a means for verifying or testing that a universal transmitter has been properly programmed, for example, by comparing pulse-modulated transmission of the newly programmed universal transmitter to that of the template transmitter used to program it.

In a specific embodiment of the programming system of this invention, the frequency of the universal transmitter is matched to that transmitted by an encoded template UHF transmitter by detecting the frequency of the UHF signal emitted from the template transmitter with the programming unit and subsequently tuning the frequency transmitted by the universal transmitter to match the frequency detected by the programmer. This can be accomplished, for example, by coupling an adjustable frequency filter to the UHF receiver of the programming unit. The UHF receiver generates an output signal proportional to the intensity of the transmission received and the programming unit contains a means for detecting the magnitude of that output signal. On receiving a transmission from a template transmitter, the frequency filter of the receiver is adjusted to maximize the signal output from the receiver. This selectively tunes the receiver to pass only that portion of the UHF spectrum substantially equal to that transmitted by the encoded transmitter. The frequency of the UHF signal of the universal transmitter can then be selectively tuned to match the frequency-selected receiver of the programming unit. The unprogrammed universal transmitter is activated to transmit a UHF signal of nonspecific UHF frequency and modulation pattern, the transmission is received by the frequency adjusted receiver of the programmer and the frequency of the UHF signal of the universal transmitter is adjusted to maximize the signal output of the frequency-adjusted receiver. The universal transmitter is thus selectively tuned to transmit that portion of the UHF spectrum substantially equal to that transmitted by the template transmitter. On receiving the transmission from the template transmitter the programming unit demodulates the pulse-modulated signal and transfers the resulting modulation pattern in binary form to a memory in the universal transmitter. The universal transmitter is thereby programmed to transmit the frequency and modulation pattern of the template transmitter.

BRIEF DESCRIPTION OF THE DRAWINGS

Additional objects and benefits of this invention will be apparent from the following detailed description and drawings, in which.

DETAILED DESCRIPTION OF THE PREFERRED EMBODIMENTS

Figure 1A:
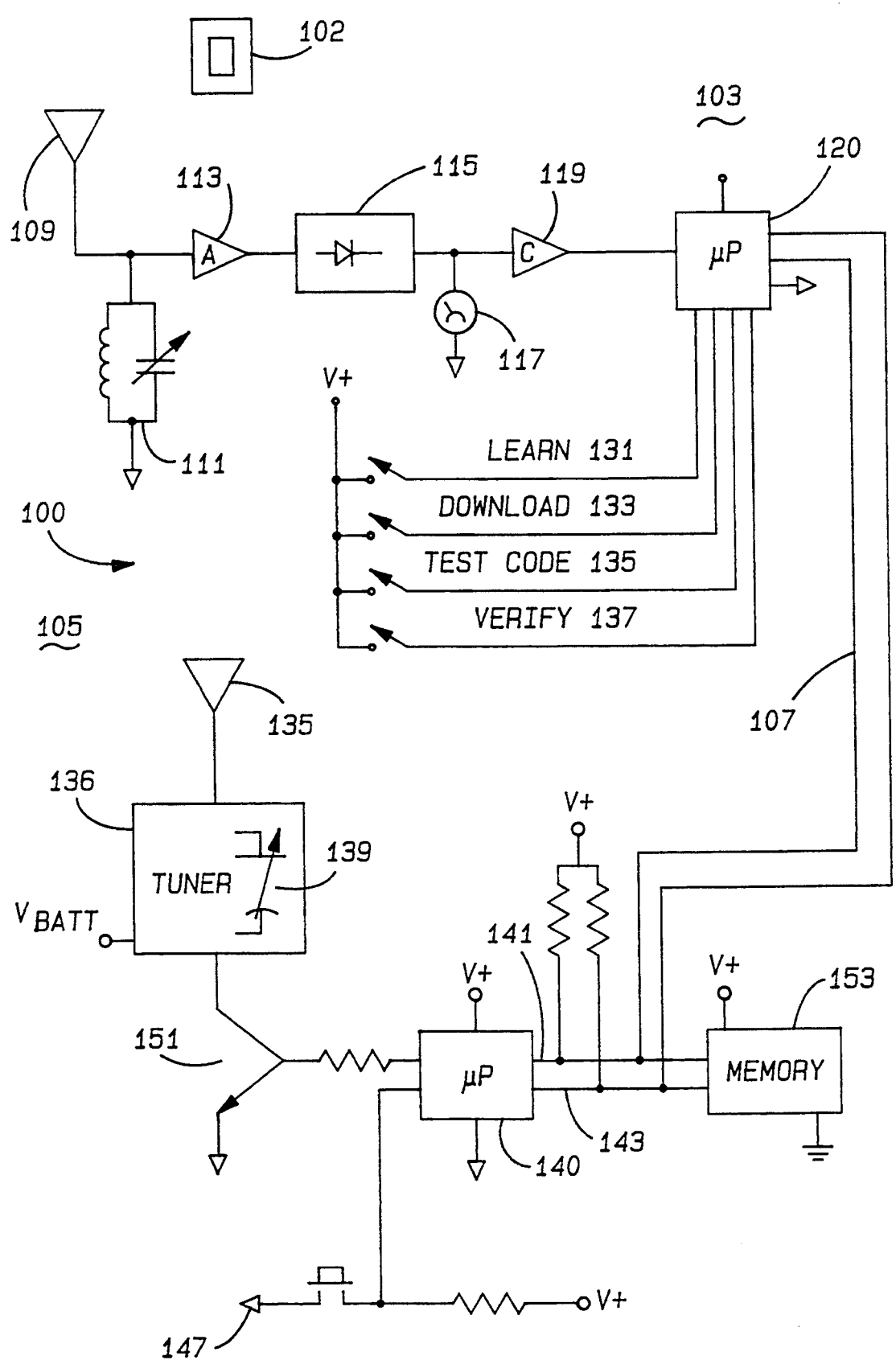
FIG. 1A is a schematic diagram of an exemplary universal programming system of this invention.

Referring now to FIG. 1A, the remote control system 100 of the present invention comprises a programming unit 103 and a universal transmitter 105. The programmer can be coupled to the transmitter via a data interface such as a serial data bus 107 during programming of the transmitter. Alternatively, wireless communication arrangements could be utilized. A template remote control transmitter 102 which emits a pulse-modulated UHF signal is placed in proximity to the programming unit. The programming unit comprises a UHF receiver, such as a broad band antenna 109, coupled to an adjustable or tunable RF filter 111, such as a bandpass filter. The output of the filtered receiver is coupled to an amplifier 113 which is, in turn, coupled to a detector 115. The detector 115 generates an analog waveform which is representative of the modulated output from the filtered receiver. The output of the detector is connected to both a means for detecting or indicating the amplitude of the detector's output 117 and a voltage comparator 119 which shapes the analog waveform generated by the detector and shifts its voltage levels to a logic level binary signal. The output of the comparator is connected to an input of a microcontroller 120.

The microcontroller 120 comprises an oscillator for internal timing, memory for storing time intervals representative of a modulation pattern, read-only memory for the storage of the internal program that controls the microcontroller function, input and output circuitry, a timer for measuring the on and off intervals of a modulated signal, and a central processing unit. Other inputs into the microcontroller 120 allow switching between two modes, a "Learn", and "Download" mode (113 and 133, respectively), and optional "Testcode" and "Verify" modes (135 and 137, respectively), the operation of which will be detailed below. The data interface bus 107 carries the output of the programming unit microcontroller 120 to the universal transmitter 105.

The universal transmitter 105 comprises an UHF antenna 135 coupled to a free-running oscillator 136. The oscillator 136 is provided with a tuner 139 by which the frequency of transmission of the transmitter oscillator/antenna combination can be adjusted. Current is supplied to the transmitter by a switch 151 which is controlled by a transmitter microcontroller 140. The transmitter also comprises a programmable memory 153 capable of storing data, for example, as provided from the programmer 103 via the data interface 107. The programmable memory 153 also comprises a means for transferring data stored therein to the microcontroller 140, for example, via serial data and clock lines 141 and 143, respectively. The transmitter microcontroller 140 is coupled to a transmit switch 147. In response to actuation of the transmit switch, the microcontroller 140 retrieves the modulation pattern stored in the programmable memory 153 and duplicates the stored modulation pattern by timed activation and deactivation of switch 151.

The system of FIG. 1A operates as follows to program the universal transmitter to duplicate the transmission characteristics of a selected template remote control transmitter.

A selected template transmitter 102 is activated such that the modulated signal that it transmits can be received by the antenna 109 of the programming unit. While the transmitter is activated, the center frequency of the bandpass filter 111 is tuned to obtain a maximum amplitude of the output signal generated by the filter/antenna combination as indicated by amplitude meter 117. In this step the adjustable filter of the programming unit is tuned to match the frequency transmitted by the template transmitter 102 and thereby detects the frequency of that UHF signal. The receiver of the programming unit is frequency tuned to pass only that portion of the UHF spectrum that is substantially equal to that transmitted by the template transmitter.

While the template remote control transmitter is activated, the microprocessor of the microcontroller 120 samples the output of detector 115, which has been shaped and level shifted by comparator 119, and records the waveform of the transmission as a series of ON and OFF time intervals in an intermediate memory in the microcontroller 120 of the programming unit. This step determines the modulation pattern being transmitted by the template transmitter and temporarily stores the modulation pattern in memory. The modulation pattern can then be transferred to a memory 153, preferably non-volatile memory, in the universal transmitter 105 via the data interface 107.

The universal transmitter 105 is activated to transmit a default signal having a UHF frequency (somewhere between about 300–400 MHz) which can be modulated to transmit a default modulation pattern, for example, a modulation pattern previously stored in permanent memory of the universal transmitter 105. The default signal from the universal transmitter is received by the frequency-selected antenna 109 of the programmer. The universal transmitter output oscillator 136 is then tuned by tuning means 139 to maximize signal amplitude detected at meter 117. This step matches the UHF frequency transmitted by the universal transmitter 105 to that of the template remote control transmitter 102. The resulting frequency tuned universal transmitter 105 transmits a signal having a frequency that is substantially the same as that transmitted by the template transmitter 102.

As used herein, when referring to the frequency of a UHF signal, the terms "substantially equal to" or "substantially the same" means that the frequency transmitted by the programmed universal transmitter is such that it will be recognized by a receiver that is actuated by the template transmitter.

Optionally, in a TESTCODE mode, the programming unit 103 can transfer a temporary default or test modulation pattern to the memory 153 in the universal transmitter 105. This default modulation pattern is then retrieved to generate a modulated UHF signal during frequency tuning of the universal transmitter rather than using a pattern permanently stored therein.

Optionally, in a VERIFY mode, the programming of the universal transmitter 105 can be verified by comparing the modulated signal transmitted by the newly programmed universal transmitter 105 and that transmitted by the template transmitter 102. In addition or alternatively, the modulation pattern of the signal transmitted by the newly programmed universal transmitter can be demodulated by the programming unit and the resulting modulation pattern that is determined can be compared to the modulation pattern of the template device that is stored in memory in the programming unit. In either case, a successful match between the transmission of the template transmitter 102 and the newly programmed universal transmitter 105 can be indicated on the programming unit 103 by a visual or auditory signal.

With respect to the components of the programming unit of FIG. 1A, the receiving antenna 109 can be a simple looped conductor antenna, a dipole antenna or the like. The antenna 109 is configured, by means known to the art, to allow it to produce a radio frequency (rf) voltage at its output terminal in the presence of a transmitted electromagnetic field in the frequency range of about 300–400 MHz. The antenna 109 is preferably impedance matched to the subsequent band pass filter 111. The band pass filter 111 excludes transmissions received by the antenna 109 which are outside of its passband.

The bandpass filter 111 is chosen such that its passband is about ±200 KHz from the filter's center frequency or passband setpoint. The center frequency of the filter can be adjusted either manually, for example, employing a trimmer capacitor, or electronically, for example, using a varactor diode controlled by microcontroller 120. Only signals within the filter's passband are allowed to pass through the filter with amplitude sufficient to trip the detector 115. The amplifier 113 should provide gain in the range of about 10–20 dB, and is, for example, a discrete transistor with appropriate matching and biasing networks, or a monolithic device.

The detector 115 demodulates the amplitude modulated signal. Several circuit configurations can perform this function as is known in the art. Functional circuit configurations allow current to flow into a capacitance during alternate half-cycles of the rf waveform such that a voltage appears across the capacitor when a rf signal is present. A resistance placed across the capacitor allows the voltage to quickly decay during intervals when no rf signal is present. The RC time constant for such circuits is typically about 40 ns.

The amplitude of the input rf voltage from the antenna 109 is proportional to the peak output voltage of the detector 115. The output voltage meter 117 is a standard indicating device. Alternatively, output voltage can be measured and displayed with electromechanical or solid state digital devices. In an automated system, adjustment of the filter to optimize detector amplitude can be accomplished employing a microcontroller into which detector amplitude is sent via a A/D converter.

The comparator 119 is typically a monolithic integrated circuit. Its output swings between its voltage supply rails in response to small voltage differences between the input terminals. Such a comparator "squares" the low-level analog waveform and converts it to a logic level signal which is compatible with the digital inputs of the microcontroller.

The microcontrollers 120 and 140 comprise microprocessor, RAM, ROM, oscillator, timer and decoded I/O port functions integrated on a signal chip. Instructions necessary for the microcontroller to perform its intended function are incorporated (or masked) into the chip during its manufacture, as is well-known in the art. For example, the microcontrollers can be single-chip masked ROM microcomputers such as those of the Zilog Z8 family, specifically the 86C30.

The transmitting antenna 135 of the universal transmitter 105 functions in conjunction with the oscillator 136 to generate and transmit a frequency between about 300 to 400 MHz. The antenna 133 can be a part of a resonant network.

The oscillator's frequency is adjustable or tunable via the resonant frequency of a LC network in the feedback loop of an active device, such as a transistor. The frequency of oscillation is determined by the LC time constant and tuning can be accomplished by varying L or C. When a synthesized oscillator or an oscillator whose frequency is under microprocessor control is employed, tuning is preferably done via an electronically variable capacitance (e.g., varactor diode). The power of the transmitter is limited by FCC regulations. It is preferred that the transmitted power should be as close to the maximum limit possible under these regulations to maximize actuation range.

Power is supplied to the oscillator 136 through a switch 151 which is preferably an electronic on/off switch. A standard configuration for such a switch is a bipolar transistor arranged in a common emitter configuration, as is known in the art. In response to a small control current from the microcontroller 140, the switch 151 supplies current to the oscillator 136 for operation. The microcontroller 140 functions in response to a transmit switch 147 to retrieve ON and OFF intervals stored in the programmable memory 153. The microcontroller 140 duplicates the modulation pattern embodied in the stored intervals, by activating the oscillator switch 151 during ON intervals and deactivating the switch 151 during OFF intervals.

Typically, the stored data is retrieved from the programmable memory 153 in a serial fashion. The actual protocol employed by microprocessor 140 for data retrieval depends on the type of programmable memory employed.

The programmable memory 153 is preferably a device capable of storing data for indefinite periods in the absence of an applied voltage. An electrically erasable programmable read-only memory device (EEPROM) is particularly well-suited to this application. A variety of EEPROMs having storage capabilities between 1,000 to 4,000 bits of information are available at low cost. An EEPROM typically is equipped with a serial interface for data storage and retrieval. For example, an EEPROM such as Xicor 24 CO1 can be employed. The microcontroller 140 is adapted via appropriate masking, as understood in the art, to control a particular programmable memory device.

Figure 1B:
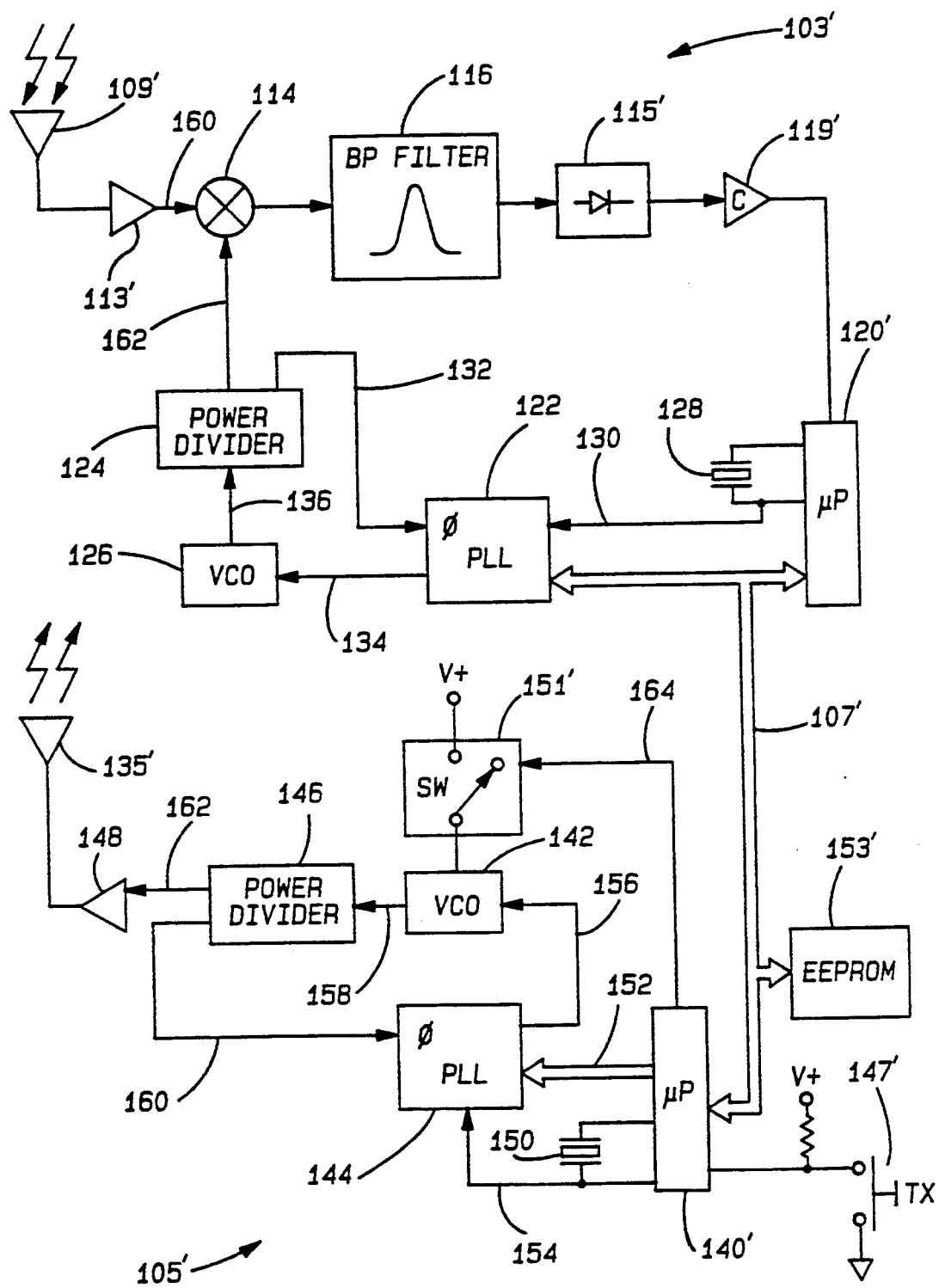
FIG. 1B is a schematic diagram of an alternative embodiment of a universal programming system arranged in accordance with the principles of the invention.

An alternative embodiment of the programmer universal transmitter combination is set forth in FIG. 1B. In the alternative arrangement of FIG. 1B, the frequency of the incoming signal from a template transmitter is "learned" automatically, without necessity for manual tuning and signal peak detection by a technician, by use of heterodyne frequency synthesis.

With reference to FIG. 1B, programming unit 103' includes receiving antenna 109' having its output coupled via rf amplifier 113' to a first input 160 of mixer 114. An output of mixer 114 is coupled to an input of bandpass filter 116, whose output is coupled to an input port of programmable microcontroller 120' via wave-shaping and level shifting comparator 119'.

Crystal oscillator 128 of microcontroller 120' is coupled to a reference input of phase-locked loop (PLL) 122, while bus 107' couples micro controller 120' to a programming input of PLL 122. An output 134 of PLL 122 is coupled to an input of voltage controlled oscillator 126, whose output is coupled to an input of power divider 128, which has a first output coupled to a second input 162 of mixer 114 and a second output coupled to a phase input 132 of PLL 122.

Data bus 107' is additionally coupled via a suitable connector (not shown) to the universal transmitter 105' to be programmed.

The operation of programming unit 103' of FIG. 1B may be summarized, as follows. A signal in the range of 300–400 MHz is received from the template transmitter (not shown) by antenna 109', amplified by rf amplifier 113' and fed to rf port 160 of mixer 114. The output of mixer 114 is the sum and difference frequencies of the signals applied to rf port 160 and LO port 162, such that the frequency of the mixer output is given by $$F_{out}=(F_{rf}+F_{Lo})+(F_{rf}-F_{Lo})$$

The LO port 162 of mixer 114 is fed from one output of power divider 124.

The output of mixer 114 is coupled to bandpass filter 116, which has a fixed center frequency on the order of 70 MHz a - 3 dB band width of on the order of 100 KHz, and a minimum Q of approximately 100. The output of filter 116 is coupled to detector 115' for detection/demodulation of the envelope of the incoming signal. This demodulated signal is coupled to comparator 119' for shaping and level shifting in the same manner as described earlier with reference to comparator 119 of FIG. 1A. The shaped and level shifted comparator output is coupled to an input port of microcontroller 120'. Presence of a signal within the passband of filter 116 is indicated by transitions a the output of comparator 119', with ON and OFF intervals measured by microcontroller 120' in the manner previously described with reference to FIG. 1A.

Voltage controlled oscillator 126 generates a signal in the frequency range of 370–470 MHz and is controlled by a dc tuning voltage at path 134 supplied by an output of PLL 122'. The output 136 of oscillator 126 is split by a power divider 124, with a portion coupled back to the phase input 132 of PLL 122. Supplied with a stable reference frequency from the microcontroller by quartz oscillator 128, PLL 122 is capable of locking the output 136 of oscillator 126 to the much lower reference frequency of oscillator 128 by a modulus loaded into PLL 122 by microcontroller 120' via data bus 107'.

Microcontroller 120' causes the frequency of voltage controlled oscillator 126 to vary over a preselected range, (e.g., 370 to 470 MHz), by sequentially loading PLL 122 with appropriate values via bus 107'. When the input signal from amplifier 113' is equal to the voltage controlled oscillator frequency less 70 MHz, the output frequency of mixer 114 will lie within the passband of filter 116, and a signal from comparator 119' will be detected by microcontroller 120'. The value loaded into PLL 122 at the time of such signal detection is representative of the input signal frequency being "learned" by unit 103', and such frequency is stored by microcontroller 120' for later downloading to universal transmitter 105'.

Universal transmitter 105' is coupled via bus 107' to the programming unit 103' and includes an EEPROM 153' coupled to microcontroller 140'. An input to microcontroller 140' monitors the state of a transmit (TX) button switch 147'.

Quartz oscillator 150 of microcontroller 140' is coupled to reference input 154 of PLL 144. PLL 144 has a programming input coupled via bus 152 to microcontroller 140'. An output 156 of PLL 144 is coupled to an input of voltage controlled oscillator 142, whose output 158 is coupled to power divider 146. A first output of power divider 146 is coupled back to the phase input 160 of PLL 144, while a second output 162 is coupled via power amplifier 148 to radiating antenna 135' of universal transmitter 105'.

The power supply V+ for voltage controlled oscillator 142 is coupled thereto via switch 151', whose switching state is determined by microcontroller 140' via output 164.

The operation of universal transmitter 105' of FIG. 1B is similar to that of transmitter 105 of FIG. 1A, with the exception of frequency synthesis using PLL 144 and oscillator 142. Upon detection of activation of transmit switch 147', data corresponding to the frequency to be transmitted is retrieved from EEPROM 153' by microcontroller 140'. This data was previously downloaded to EEPROM 153' by programming mode 103' during its LEARN mode. The ON and OFF times delivered by programming unit 103' were also downloaded to EEPROM 153', and are used by microcontroller 140' to control the conduction state of switch 151', which, in turn, controls voltage control oscillator 142. The operation of PLL 144 as a frequency synthesizer is identical to that of PLL 122 of programming unit 103'.

Figure 2A:
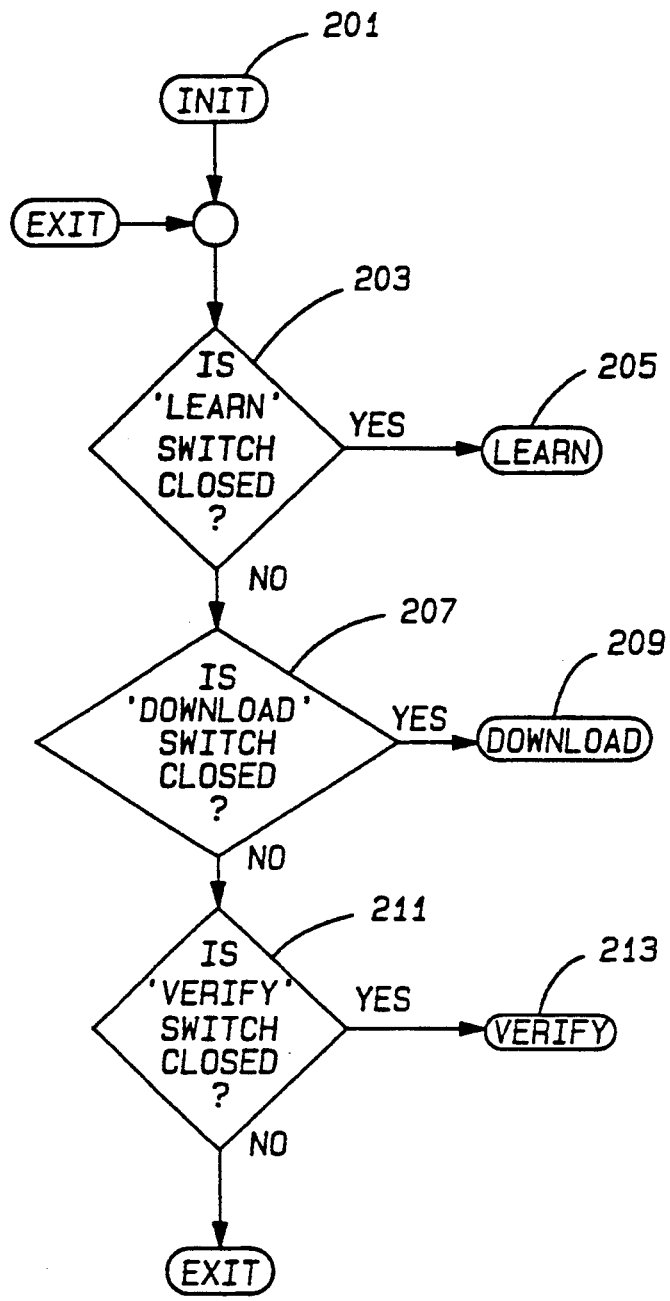
FIGS. 2A–2E contain procedural flow charts for the operation of the microcontroller of the programming unit of FIG. 1A or 1B.

In either embodiment described above, microcontroller 120 is configured to have two (or optionally three or four) modes of operation accessible by switches 131–137. The major program routines carried out by microprocessor 120 of the programming unit 103 of FIG. 1A (or microprocessor 120' of FIG. 1B) are set forth in the flow charts of FIGS. 2A–2E. In FIG. 2A, the main program for the programming unit's microprocessor is set forth. Upon initialization at step 201, the main program then sequentially tests for the activation of the various switch positions designating the various operating modes. If the LEARN switch is closed then the decision block 203 transfers program control to the LEARN mode 205. If the DOWNLOAD switch is closed then at decision block 207 program control is passed to the DOWNLOAD routine 209. Finally, if the VERIFY switch is closed then at decision block 211 the main program routine transfers control to the VERIFY routine 213.

Figure 2B:
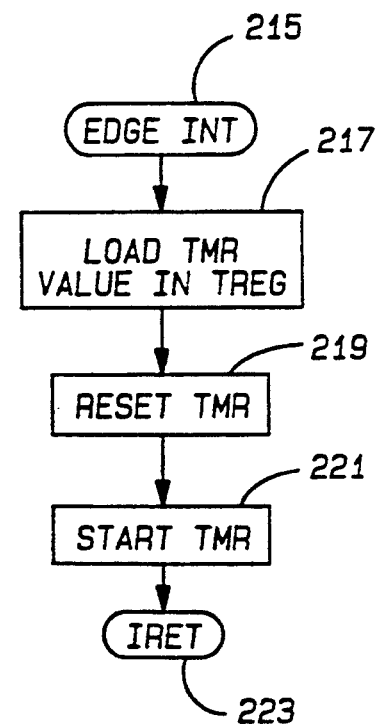

Also as part of its normal task, microprocessor controller 120 of FIG. 1A (or controller 120' of FIG. 1B) continuously scans the output of comparator 119 for a transition between the two levels of the signal presented at the output of that comparator. Whenever a transition in either direction between the two rail supplies of comparator 119 is detected the main program of FIG. 2A is interrupted and the interrupt service routine of FIG. 2B is entered at edge interrupt point 215. During the interrupt service routine a timer value is loaded into a timing register TREG at step 217, the timer TMR is reset to zero at step 219 and restarted at step 221. The interrupt routine then returns control to the main program at return point 223. The edge interrupt routine 215 interprets successive values of the timer TMR to represent alternating ON and OFF times of the modulation pattern represented on the output of comparator 119. Then, during the LEARN mode, to be discussed below, these time values in register TREG are stored in successive locations in a table in a memory of the microprocessor 120 of FIG. 1A (or 120' of FIG. 1B). In the LEARN mode, the microcontroller 120 or 120' measures the time intervals between transitions of the comparator's output through the use of its internal timers and stores the time intervals in local memory. The ON and OFF intervals represent the modulation pattern of the template remote control transmitter.

Figure 2C:
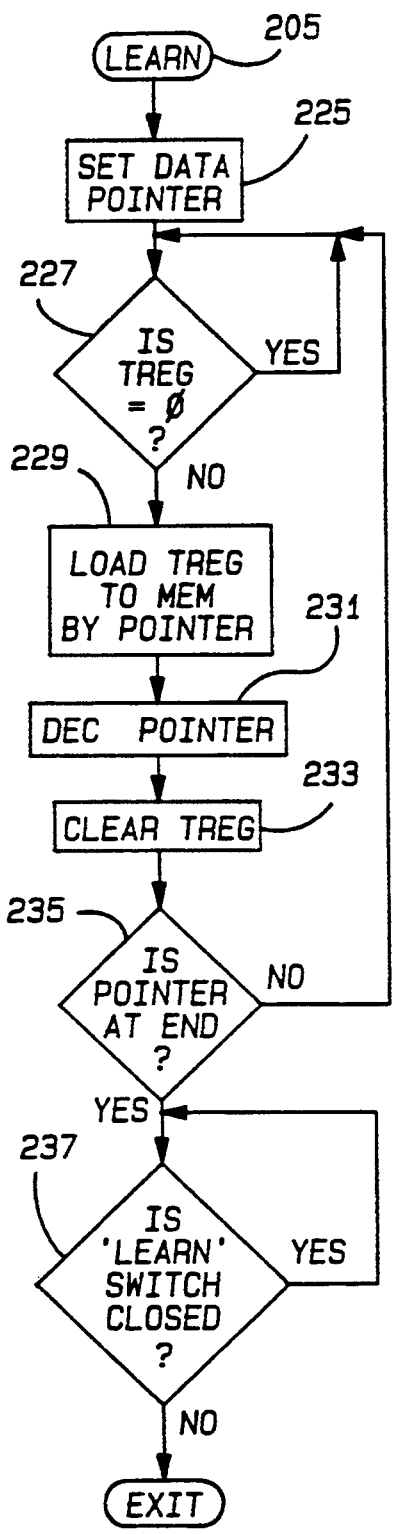
Figure 2D:
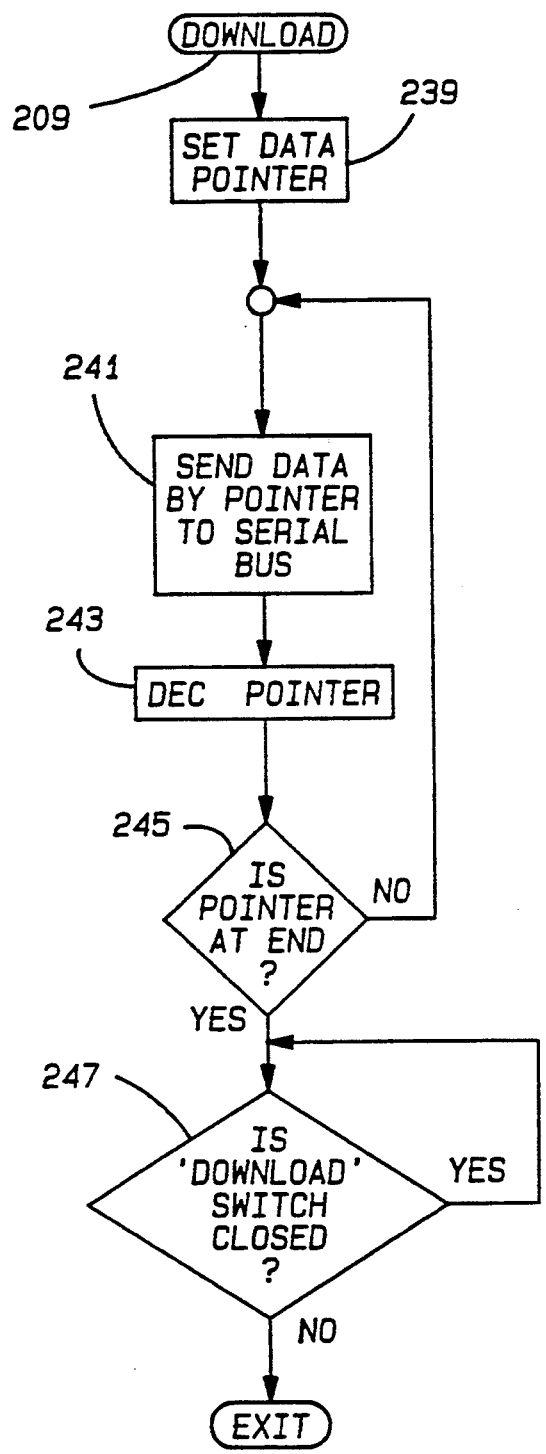

The LEARN mode program flow of microprocessor 120 or 120' is set forth in FIG. 2C. After entering the routine at step 205, a pointer to the data table to hold the ON and OFF times is initialized to point to the highest address in the table at step 225. Then at decision block 227 the contents of the timing register TREG are tested to see if its contents are zero. If the contents are zero, program flow continues to loop to the decision block at 227 until such time as non-zero contents are detected. When non-zero contents are detected, then at step 229 the contents of TREG are stored in the memory table in accordance with an address determined by the pointer value. The pointer is then decremented at step 231 and the timing register TREG is reset to zero at step 233. If as determined at step 235, the pointer value has not reached its lowest or end point value, then program control is returned to decision step 227 to continue filling up the memory table with ON and OFF time values of the modulation pattern being stored. If the pointer indicates that the table is full, then at step 237 the LEARN switch state is tested and when it has been turned off the program returns to the main program flow of FIG. 2A. Hence at the end of the LEARN mode, the memory table of ON and OFF times if full. Then, pursuant to techniques known to the art, the table contents are examined by the microprocessor to look for a repeating pattern of ON and OFF times. When such a pattern is detected, only a single complete pattern need be stored for downloading to the universal transmitter.

In the DOWNLOAD mode, the stored ON and OFF intervals are transferred in a serial fashion to the programmable memory 153 of the universal transmitter 105. The program flow during the DOWNLOAD mode is set forth in FIG. 2D. Upon entering the DOWNLOAD routine at step 209, a data pointer into the previously loaded table discussed above with respect to the LEARN mode is initialized at step 239. At step 241 the data at the location in the LEARN table designated by the pointer is transmitted via serial data bus 107 of FIG. 1A to the programmable memory 153 of the universal transmitter 105. Next at step 243, the table pointer is decremented, and at step 245 if the pointer is not at its minimum value indicating that the total table contents have been downloaded, then control is passed back to step 241 to continue the downloading process. When the pointer indicates that the table is at its end, then the state of DOWNLOAD switch is monitored at decision block 247 until it is switched off, at which time program control is returned to the main program of FIG. 2A.

Two additional optional modes may be included in the programming unit: A VERIFY and a TESTCODE mode. The programming unit 103 functions as an rf signal detector when the transmission frequency of the universal transmitter 105 is being tuned to match the frequency transmitted by the template remote control transmitter 102. During this tuning step, the programming unit 103 is preferably not in the LEARN mode, the DOWNLOAD mode, nor in the optional VERIFY mode. The universal transmitter 105 can simply be programmed to transmit a default test modulation pattern during this frequency tuning step. Alternatively, the programming unit may have an additional optional TESTCODE mode. In the TESTCODE mode, a default modulation pattern is transferred to the programmable memory 153 of the universal transmitter 105 in a manner similar to that used in the DOWNLOAD mode. The default signal is then transmitted by the universal transmitter 105 during tuning of its frequency to match that of the existing remote control transmitter 102.

In the optional VERIFY mode, a comparison is made between the modulation pattern transmitted by a newly programmed universal transmitter and either the modulation pattern stored in the programmer 103 or the modulation pattern of the existing remote control template transmitter 102. A modulation pattern match indicates a successful learning and download sequence. A match (or absence of a match) can be signaled by an appropriate indicator, (e.g., a visual or auditory signal).

Figure 2E:
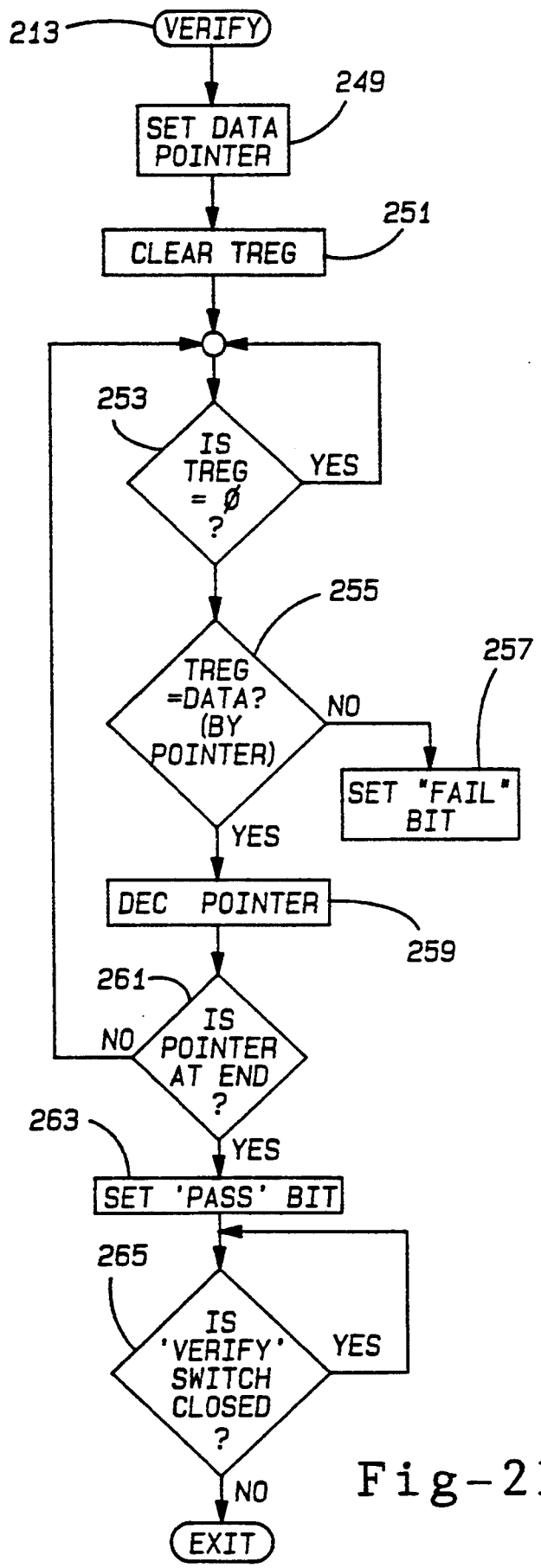

The VERIFY routine is set forth in FIG. 2E. Upon entering the routine at step 213, a data pointer into the table of ON and OFF times is initialized at step 249, and the timer register TREG is zeroed at step 251. The contents of the timer register TREG is monitored to determine whenever its contents are non-zero at block 253. When a non-zero value is detected, then the contents of the timer register TREG are compared to the data read from the table in accordance with the value of the pointer at step 255. If any such comparison results in a difference between the contents of the timer register and the data table by greater than an allowable tolerance margin, then a failure bit is set at step 257. For so long as the comparisons are successful at step 255 then the table pointer is decremented at step 259 and the value of the pointer is examined at step 261 to determine whether the entire table pattern has been compared with the signals emanating from the universal transmitter 105 of FIG. 1A. This test is preformed at block 261. When the pointer indicates that the entire table has undergone examination with respect to signals emanating from the universal transmitter, then a success or PASS bit is set at step 263. The VERIFY switch state is then monitored at block 265, and the routine returns control to the main program flow of FIG. 2A upon the opening or deactivation of the VERIFY switch position.

Figure 3A:
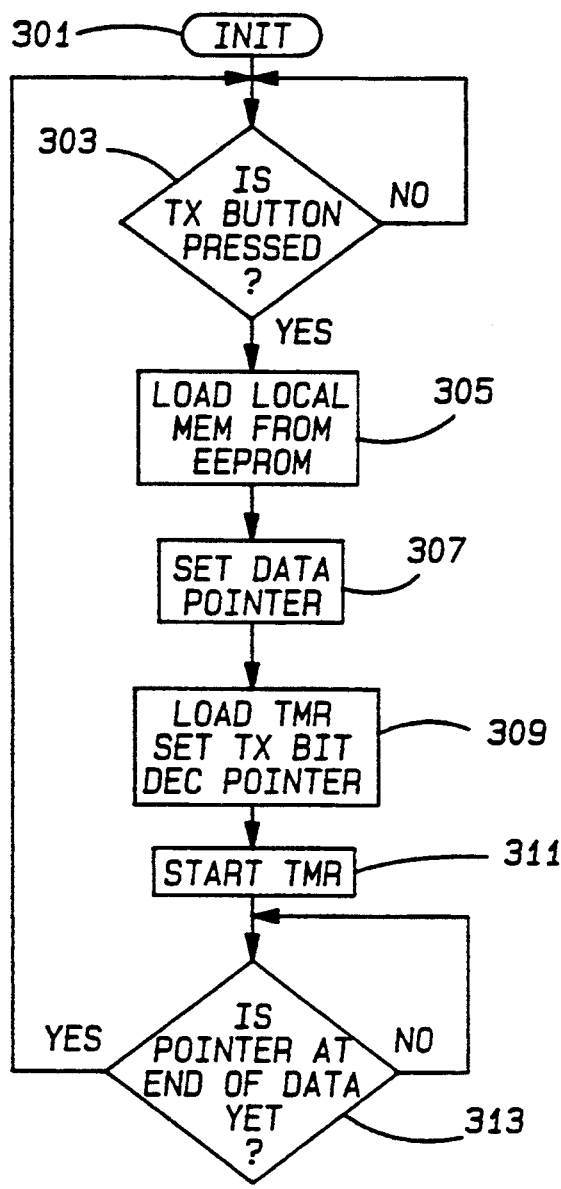
FIGS. 3A–3B contain procedural flow charts for the operation of the microcontroller of the universal transmitter of FIG. 1A or 1B.
Figure 3B:
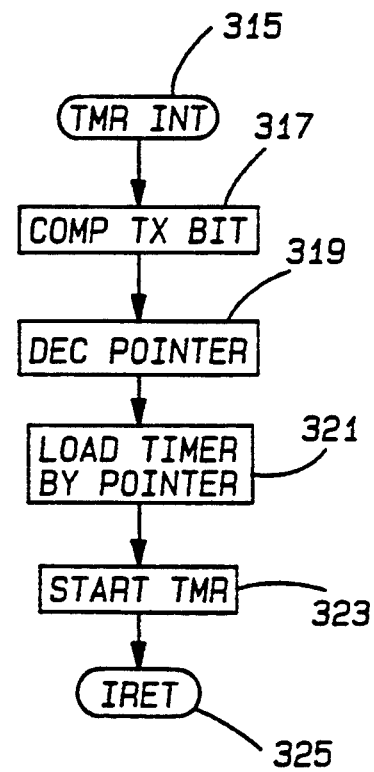

The principle program flow in the microprocessor unit 140 of the universal transmitter 105, (or unit 140' of FIG. 1B) is set forth in FIGS. 3A and 3B. The main program in FIG. 3A begins with initialization step 301. During the major program flow, the state of the transmit switch or button 147 of FIG. 1A is monitored at decision block 303 until an activation state is detected, whereupon at step 305 the local or scratch pad memory of microprocessor 140 is loaded with ON and OFF times representing the desired modulation pattern from the contents of EEPROM 153, whose contents have been previously determined during the DOWNLOAD operating mode of the microcontroller 120 of programming unit 103. Next at step 307, a data pointer into the local memory of microprocessor 140 is initialized. Next at step 309, a timer is programmed with the contents of the first entry in the local scratch pad memory with an ON time, a TX bit is set indicating that transmission is to be activated, and the scratch pad table pointer is decremented. At step 311 a timer is started, and its duration is governed in accordance with the value loaded to the timer from the scratch pad table. During the operation time of the timer, transistor switch 151 of FIG. 1A will be rendered conductive thereby enabling free running oscillator 136 to emit a signal via UHF antenna 135 at a frequency previously determined via tuner 139. In the embodiment of FIG. 1B, switch 151' enables voltage controlled oscillator 142 only during ON times designated by the timer. At block 313 the table pointer is examined to determine whether the complete sequence of ON and OFF times have been processed. When the complete sequence has been transmitted, program control returns to step 303 to monitor for a subsequent activation of the transmit or TX switch.

When the programmable timer TMR has timed out, an interrupt is generated transferring program control to the interrupt service routine 315 of FIG. 3B. During interrupt servicing, the state of a bit monitoring the state of the transmit button is complemented at step 317, the pointer is decremented at step 319, a new timing value is loaded into the timer TMR in accordance with the table value designated by the pointer at step 321 and the timer is restarted at step 323, whereupon at step 325 control is returned to the main program of FIG. 3A. It will be seen that by complementing the transmit bit upon each entry into the interrupt service routine, the times in the timer will alternatively indicate ON and OFF times in accordance with the desired modulation pattern to be transmitted by the universal transmitter unit 105 of FIG. 1A (or 105' of FIG. 1B).

An important feature of the invention is the separation of programming and transmitting functions. Such functional segregation removes from the universal transmitter costly hardware necessary to measure (or match) an unknown frequency and determine the modulation pattern from the template transmitter. The universal transmitter of this invention requires only a simple and inexpensive microcontroller. The cost of the installed universal transmitter is thus minimized. The more expensive elements required for programming the universal transmitter are kept in the programming unit which can be amortized over many universal transmitters.

A universal transmitter employing a frequency synthesizer, a phase-locked source or a frequency-locked source to directly generate the required frequency can be employed in the programming system of the present invention as set forth above, for example, in conjunction with FIG. 1B. The universal transmitter would then generate the required frequency based on instructions from the programming unit which would detect the frequency of the template transmitter. At this time, devices for direct frequency synthesis of radio frequency oscillators, as set forth above with reference to the alternative embodiment of FIG. 1B, are believed to be too expensive for use in an economical and practical universal transmitter. Thus, such direct methods are not preferred at present. As a result, the embodiment of FIG. 1A provides an indirect method of matching the frequency of the universal transmitter to that of the template transmitter. Direct methods for frequency matching (FIG. 1B) may become practical for use in the remote control system of this invention when and if the costs of radio frequency synthesizers and like devices significantly decrease. In any event, such direct synthesis approaches are considered to be within the scope of this invention.

While the invention has been described in terms of what are presently considered to be the most practical and preferred embodiments, the invention is not limited to the disclosed embodiments or exemplified components. It is intended that all art-recognized equivalents and alternatives of specifically disclosed methods, components and devices are included within the spirit and scope of this invention. The scope of this invention is to be determined by the appended claims.

What is claimed is:

1. A system for transferring a frequency and modulation pattern of an encoded modulated template transmitter, which functions to actuate a device remote therefrom, to a universal transmitter such that said universal transmitter is thereby programmed to transmit the frequency and modulation pattern of said template transmitter and such that said universal transmitter thereby functions to actuate said remote device, the system comprising:

said universal transmitter including:
means for transmitting a first signal to a programming unit, means, coupled to said means for transmitting, for tuning a frequency of the first signal to be transmitted, memory means for storing said modulation pattern to be transmitted, means, coupled to said memory means for storing, for modulating the first signal such that said modulation pattern stored in said memory means is transmitted by said universal transmitter when said universal transmitter is actuated, and means, coupled to said means for modulating, for directly actuating transmission of said modulated first signal by said universal transmitter; and said programing unit separate from said universal transmitter including:
means for receiving a modulated second signal, means, coupled to said means for receiving, for detecting a frequency of the second signal from said template transmitter, means, coupled to said means for detecting, for determining a modulation pattern of the second signal and means, coupled to said means for determining, for transferring the modulation pattern determined by said means for determining to said memory means in said universal transmitter, wherein said tuning means of said universal transmitter, said means for detecting said frequency of said second signal, and said means for determining said modulation pattern function together to match the modulation pattern and frequency of the first and second signals, and
wherein said programming unit further including means, coupled to said means for determining, for verifying that said universal transmitter, programmed by said programming unit, transmits said modulation pattern of said template transmitter by analyzing said modulation pattern generated by said programmed universal transmitter.

2. The system of claim 1 wherein said means for verifying is further coupled to said means for detecting, and wherein said means for verifying further confirms that said universal transmitter, programmed by said programming unit, transmits said frequency of said template transmitter by analyzing said frequency generated by said programmed universal transmitter.

3. The system of claim 1 wherein said operating frequency of said template transmitter and said universal transmitter is in the ultra high frequency range.

4. The system of claim 1 wherein said frequency detecting means of said programming unit comprises an adjustable frequency filter means coupled to an input of said means for receiving and means for detecting and monitoring magnitude of an output signal of the means for receiving to locate a peak output corresponding to said frequency of said template transmitter.

5. The system of claim 4 wherein said frequency detecting means and said adjustable frequency filter means comprise an antenna coupled to an adjustable bandpass filter.

6. The system of claim 5 wherein said means for receiving further comprises an amplifier which amplifies an output signal of said filter.

7. The system of claim 6 wherein said bandpass filter has a passband of about ±200 kHz from a passband center frequency of the filter.

8. The system of claim 1 wherein said programming unit further comprises an intermediate memory means for temporary storage of a modulation pattern of a received signal.

9. The system of claim 1 wherein said universal transmitter is permanently installed in a vehicle.

10. The system of claim 1 wherein said transmitting means of said universal transmitter comprises an antenna coupled to a frequency-tunable, pulse-modulated oscillator.

11. The system of claim 10 wherein said antenna and said oscillator are part of a resonant network.

12. The system of claim 1 wherein said means for determining said modulation pattern comprises a pulse modulated signal detector, which generates an analog waveform from the output signal of said means for receiving, coupled to means for shaping said analog waveform to a two level signal and means for converting said two level signal into a set of signal ON and signal OFF time intervals which represent the modulation pattern stored in said transmitter memory means.

13. The system of claim 4 wherein said means for detecting amplitude is operative to adjust said adjustable frequency filter means until maximum signal amplitude is detected, thereby providing determination of the frequency of the second signal.

14. A system for transferring a frequency and modulation pattern of an encoded modulated template transmitter, which functions to actuate a device remote therefrom, to a universal transmitter such that said universal transmitter is thereby programmed to transmit the frequency and modulation pattern of said template transmitter and such that said universal transmitter thereby functions to actuate said remote device, the system comprising:

said universal transmitter including:

means for transmitting a first signal to a programing unit, means, coupled to said means for transmitting, for tuning a frequency of the first signal to be transmitted, memory means for storing said modulation pattern to be transmitted, means, coupled to said memory means for storing, for modulating the first signal such that said modulation pattern stored in said memory means is transmitted by said universal transmitter when said universal transmitter is actuated, and means, coupled to said means for modulating, for directly actuating transmission of said modulated first signal by said universal transmitter; and said programing unit separate from said universal transmitter including:

means for receiving a modulated second signal, means, coupled to said means for receiving, for detecting a frequency of the second signal from the template transmitter, means, coupled to said means for detecting, for determining a modulation pattern of the second signal and means, coupled to said means for determining, for transferring the modulation pattern determined by said means for determining to said memory means in said universal transmitter, wherein said tuning means of said universal transmitter, said means for detecting said frequency of said second signal, and said means for determining said modulation pattern function together to match the modulation pattern and frequency of the first and second signals, and wherein said programming unit further includes means, coupled to said means for detecting, for verifying that said universal transmitter, programmed by said programing unit, transmits said frequency of said template transmitter by analyzing said frequency generated by said programmed universal transmitter.

* * * * *